United States Patent [19]
Tsuruta et al.

[11] Patent Number: 5,461,253
[45] Date of Patent: Oct. 24, 1995

[54] SEMICONDUCTOR SUBSTRATE STRUCTURE FOR PRODUCING TWO ISOLATED CIRCUITS ON A SAME SUBSTRATE

[75] Inventors: Kazuhiro Tsuruta, Nishio; Seizi Huzino, Anjyo; Mitutaka Katada, Nishio; Tadashi Hattori, Okazaki; Masami Yamaoka, Anjyo, all of Japan

[73] Assignee: Nippon Steel Inc., Nishi, Japan

[21] Appl. No.: 271,585

[22] Filed: Jul. 7, 1994

Related U.S. Application Data

[63] Continuation of Ser. No. 8,089, Jan. 22, 1993, abandoned, which is a continuation of Ser. No. 707,188, May 28, 1991, abandoned, which is a continuation of Ser. No. 415,132, Sep. 29, 1989, abandoned.

[30] Foreign Application Priority Data

Sep. 30, 1988 [JP] Japan .................................. 63-248737

[51] Int. Cl.⁶ .......................... H01L 27/12; H01L 27/02
[52] U.S. Cl. ........................ 257/501; 257/506; 257/526
[58] Field of Search .......................... 357/49, 59, 47, 357/50; 257/501, 506, 500, 499, 526, 528

[56] References Cited

U.S. PATENT DOCUMENTS

| | | | |
|---|---|---|---|
| T892,019 | 11/1971 | Sack | 357/49 |
| 3,500,139 | 3/1970 | Frouin et al. | 357/49 |
| 3,913,121 | 10/1975 | Youmans et al. | 357/10 |
| 4,638,552 | 1/1987 | Shimbo et al. | 357/49 |
| 4,671,846 | 6/1987 | Shimbo et al. | 357/49 |
| 4,710,794 | 12/1987 | Koshino et al. | 359/49 |
| 4,860,081 | 8/1989 | Cogan | 357/49 |
| 4,892,019 | 11/1991 | Koshino et al. | |
| 4,926,235 | 5/1990 | Tamaki et al. | 357/68 |
| 4,929,992 | 5/1990 | Thomas et al. | 357/23.9 |

FOREIGN PATENT DOCUMENTS

| | | | |
|---|---|---|---|
| 60-121715 | 6/1984 | Japan | 257/506 |
| 60-051700 | 3/1985 | Japan | 257/506 |
| 60-236254 | 11/1985 | Japan | H01L 27/00 |
| 61-042154 | 2/1986 | Japan | 257/506 |
| 61-059852 | 3/1986 | Japan | 257/506 |
| 61-182242 | 8/1986 | Japan | 257/506 |
| 61-183949 | 8/1986 | Japan | 257/506 |
| 62-004338 | 1/1987 | Japan | 257/506 |
| 62-226640 | 10/1987 | Japan | 257/506 |
| 1-107551 | 4/1989 | Japan | H01L 21/76 |
| 1107551 | 4/1989 | Japan | 257/506 |
| 6511542 | 3/1966 | Netherlands | 357/49 |

OTHER PUBLICATIONS

Akio Nakagawa, et al. "High Voltage, New Driver IC Technique Based on Silicon Wafer Direct–Bonding (SDB)" PESC '88 Record (Apr., 1988) pp. 1325–1329.

Yu Ohata and Takao Izumita, "Dielectrically Isolated Intelligent Power Switch", IEEE 1987 Custom Integrated Circuits Conference, pp. 443–445.

*Primary Examiner*—Sara W. Crane
*Assistant Examiner*—Donald L. Monin, Jr.
*Attorney, Agent, or Firm*—Cushman, Darby & Cushman

[57] ABSTRACT

A semiconductor circuit structure including a semiconductor substrate portion and at least one region provided on one main surface thereof insulatedly isolated from other regions provided on the same surface, by burying means made of an oxide film, the burying means including a bottom flat portion and at least one side wall portion provided at least in the vicinity of an edge portion of and integrally formed with the bottom flat portion, thereby a semiconductor circuit structure provided with a plurality of insulatedly isolated regions on a main surface thereof and having a high withstand voltage can be obtained in a short production process.

19 Claims, 6 Drawing Sheets

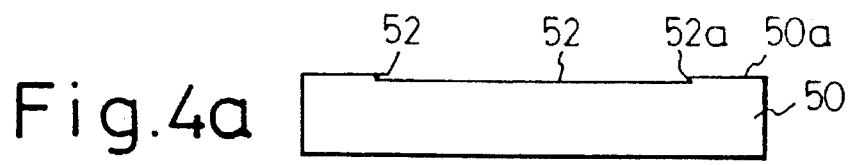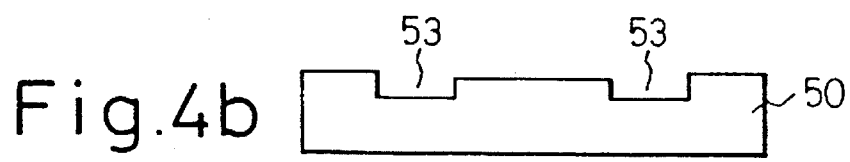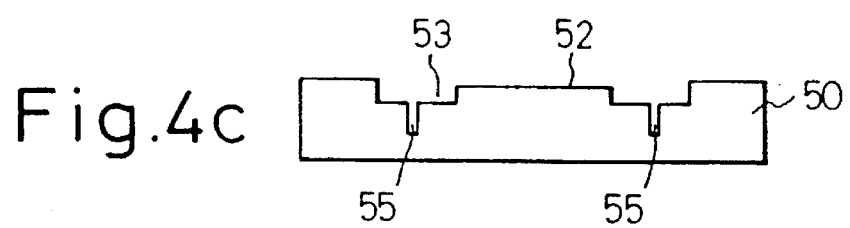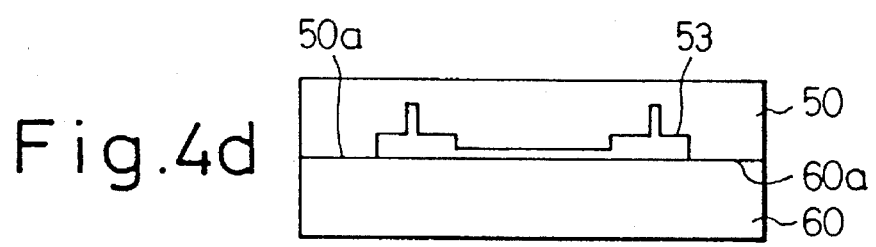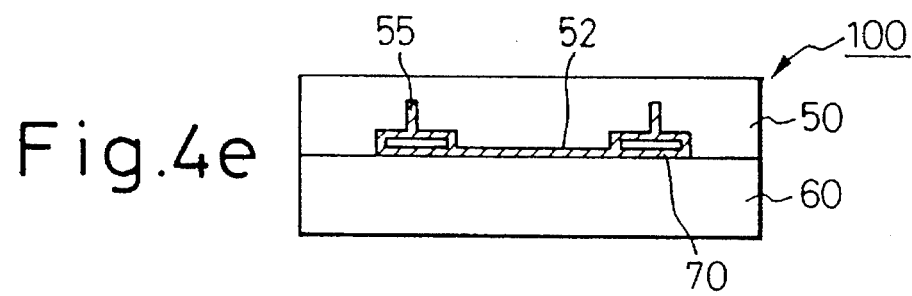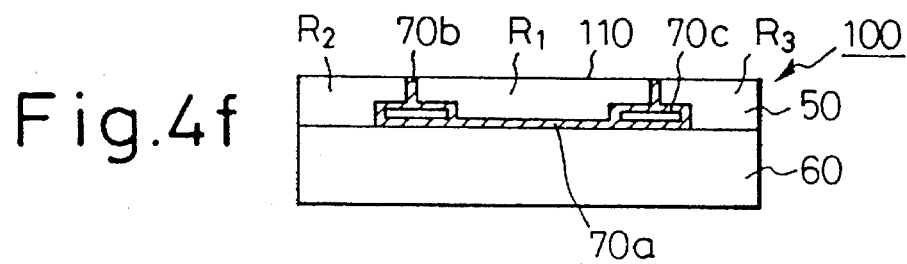

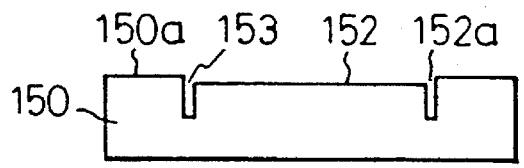
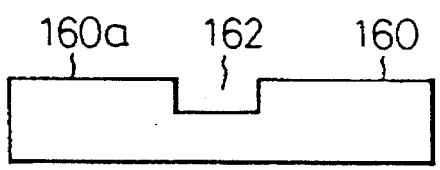
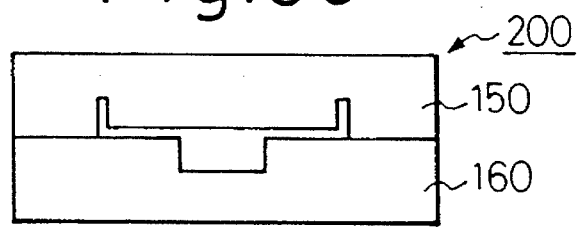
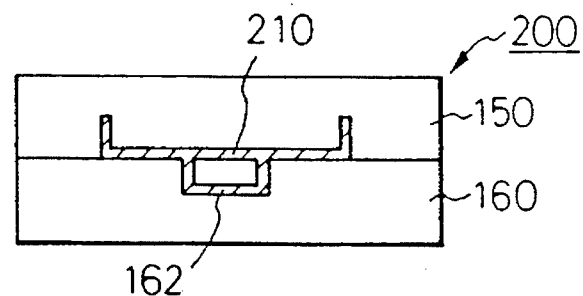
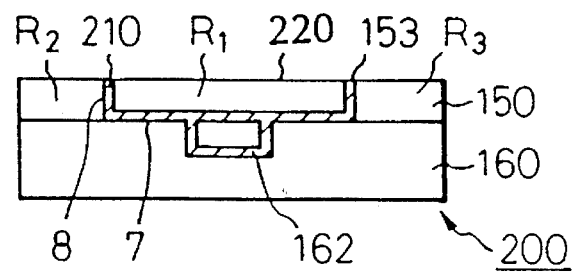

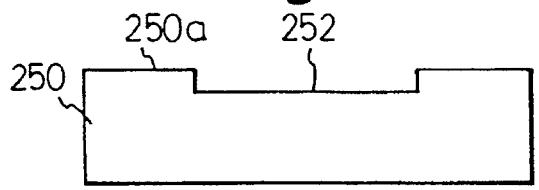
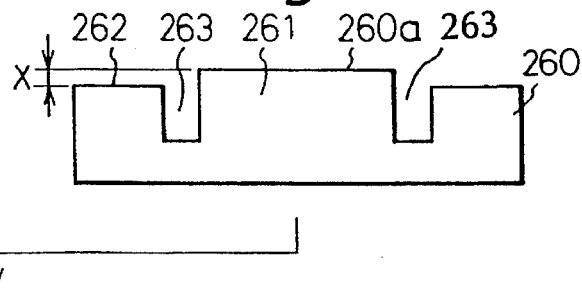
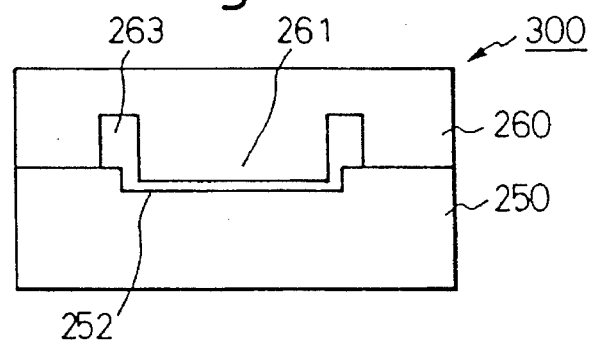
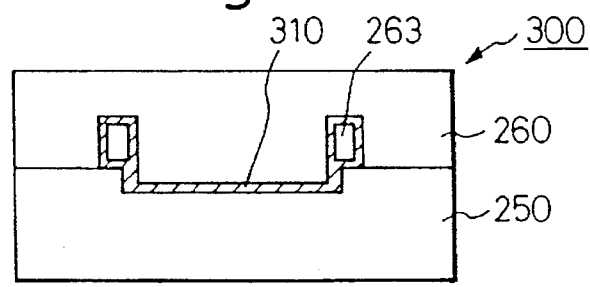
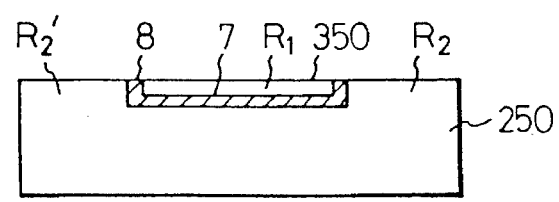

SEMICONDUCTOR SUBSTRATE STRUCTURE FOR PRODUCING TWO ISOLATED CIRCUITS ON A SAME SUBSTRATE

This is a continuation of application Ser. No. 08/008,089, filed on Jan. 22, 1993, which was abandoned upon the filing hereof which is a continuation of Ser. No. 07/707,188 filed May 28, 1991 (abandoned); which is a continuation of Ser. No. 07/415,132 filed Sep. 29, 1989 (abandoned).

BACKGROUND OF THE INVENTION

1. Field of the Invention

The present invention relates to a semiconductor circuit structure in which a plurality of elements are formed on a plurality of regions formed on at least one surface of a semiconductor substrate, and isolated from each other, and to a method for making a semiconductor circuit structure. More particularly it relates to a semiconductor circuit having an element isolating structure with characteristics to withstand high voltages.

2. Description of the Related Art

When an element isolating structure having an especially high withstand voltage is required, for example, when a high withstand voltage power element and logic circuits are formed on one chip, use is made of isolation utilizing PN junctions or utilizing insulating materials.

In the element isolating method utilizing a PN junction, an N-type epitaxial layer is first formed on a P-type semiconductor substrate, then a $P^+$ layer is provided in the epitaxial layer extending from the top surface thereof to the top surface of the P-type semiconductor substrate by the diffusion method.

By utilizing the $P^+$ layer, the portion on which a power element is to be mounted and the portion on which a logic circuit is to be mounted are isolated from each other.

Accordingly, in this method, the region on which a logic circuit is to be mounted is surrounded by the $P^+$ layer, thereby PN-junctions are formed therebetween.

When reverse bias is applied to the PN-junction, a depletion layer is formed, causing the region on which a logic circuit is to be mounted to be isolated from other regions.

This method can be carried out at a low cost, but a problem arises in that when a power element having a withstand voltage more than 300 V is formed on the substrate, the depth of the diffusion layer for the isolation has to be more than 40 μm.

This makes the time for making such an element isolating structure extremely long.

Further, the width of the diffusion is increased, increasing the loss of the area available for forming elements.

In the element isolating method utilizing an insulating material, first, a groove is formed on a predetermined region on an N-type semiconductor substrate by selective etching.

Then, a thermal oxide film is formed on the top surface of the substrate, then a polycrystalline silicon layer is deposited on the surface of the oxide film. Finally, part of the N-type semiconductor substrate is removed from the back surface to the groove by grinding.

Accordingly, the region surrounded by the groove, of the N-type semiconductor substrate, is completely isolated by an insulating material and it can possess a high isolated withstand voltage.

There is another method for element isolation using an insulating material wherein two semiconductor substrate layers are directly and integratedly joined via an insulating film and then one surface of the resultant joined substrate is selectively etched to form an isolating groove, the top end thereof extending to the insulating film.

A thermal oxide film is formed thereon, then a polycrystalline silicon layer is deposited on the oxide film to bury the groove.

The polycrystalline silicon layer is then removed from the surface thereof.

As a result, the region surrounded by the groove is isolated from other regions by the insulating material.

These methods for isolating elements by an insulating material have the advantage that an isolation region having a desired concentration of impurities and thickness can be obtained, but has the disadvantage that a vertical type power element in which the back surface of the semiconductor substrate is used as a current passage, cannot be produced, because one of the main surfaces of the substrate is insulated.

SUMMARY OF THE INVENTION

Therefore, the object of the present invention is to provide a semiconductor circuit structure by which, for example, a vertical type power element using the back surface of the substrate as a current passage can be produced and an isolated region having a high withstand voltage with almost no transverse diffusion can be produced in a short period of time.

Another object of the present invention is to provide a method for making the above semiconductor circuit structure.

To attain the first object of the present invention, there is provided a semiconductor circuit structure which includes a semiconductor substrate portion and at least one region provided on one main surface thereof insulatedly isolated from other regions on the same surface by a burying means made of an oxide film, the burying means including a bottom flat portion and at least one side wall portion provided at least in the vicinity of an edge portion of and integrally formed with the bottom flat portion.

The final product of the present invention may comprise a semiconductor substrate layer and at least a cavity provided on one main surface thereof and isolated and insulated from other areas on the same surface by a burying means made of an oxide film, the burying means comprising a flat bottomed portion and at least one side wall portion provided at least at the vicinity of an edge portion of an integrally formed with the flat bottomed portion, and is further characterized in that the cavity is made of a semiconductor substrate layer having the same concentration of impurities as the semiconductor substrate layer comprising the second regions.

Further, the final product of the present invention may a semiconductor substrate layer and at least a first region provided on one main surface thereof and isolated and insulated from second regions provided on the same surface by a burying means made of an oxide film, the burying means comprising a flat bottomed portion and at least one side wall portion provided at least at the vicinity of an edge portion of an integrally formed with the flat bottomed portion, and is characterized in that the substrate layer comprises a plurality of semiconductor substrate sublayers, each sublayer having a different concentration of impurities.

Since the semiconductor circuit structure has an element isolating region which is insulatedly isolated from other regions by an oxide film formed on one main surface of the substrate, a vertical power element can be formed in a region other than the element isolating region produced above.

Moreover, the element isolating region, i.e., insulatedly isolated region, can be formed in a short period because it is formed by only an oxide film.

In addition, an insulatedly isolated region having a high withstand voltage can be obtained, because it has less transverse diffusion portions, which usually appear when impurities are diffused in a substrate.

BRIEF DESCRIPTION OF THE DRAWINGS

FIGS. 4a to 4f are diagrammatic views of the production steps of a second embodiment of the present invention;

FIGS. 5a to 5e are diagrammatic views of the production steps of a third embodiment of the present invention;

FIGS. 6a to 6e are diagrammatic views of the production steps of a fourth embodiment of the present invention.

DESCRIPTION OF THE PREFERRED EMBODIMENTS

Preferred embodiments of the present invention will now be explained with reference to the attached drawings.

As explained above, the semiconductor circuit structure of the present invention is useful for an integrated circuit in which a plurality of regions are provided on the surface of a semiconductor substrate, the respective regions are isolated from each other, and a plurality of elements such as logic circuit and power elements, are formed in the regions.

The invention is characterized in that the insulatedly isolated regions are formed by just a burying means such as a film-like portion made of an oxide.

Therefore, the method for making the semiconductor circuit structure includes as a characteristic feature, the step in which a burying means having a special configuration is formed in a semiconductor substrate portion.

Further, in the method of the present invention, at least two different kinds of semiconductor substrate layers are used, i.e., for an embodiment, one semiconductor substrate layer has a certain concentration of impurities and another semiconductor substrate layer has a different concentration.

In this invention, the first and second semiconductor substrate layers are not limited to any specific concentration or to any conductivity.

Each semiconductor substrate layer may have the concentration and conductivity desired to attain the objects of the present invention.

For example, as shown in the embodiment, one semiconductor substrate layer may have an $N^+$ type conductivity and another may have an $N^-$ type of conductivity.

It is apparent, however, that semiconductor substrate layers having a P type conductivity and a different concentration of the impurities may be used and, further, if permitted, the semiconductor substrate layers having different conductivities from each other, for example, an N type and P type, may be used.

Moreover, in the present invention, each of two different kinds of semiconductor substrates may have a mirror polished surface at least on one main surface.

FIGS. 1a to 1f are cross-sectional views indicating the process steps for making a semiconductor circuit structure of the present invention.

In this embodiment, a first semiconductor substrate layer 5 consisting of an $N^+$ type semiconductor substrate layer, at least one surface thereof mirror polished, and a second semiconductor substrate layer 1 consisting of an $N^-$ type semiconductor substrate layer, at least one surface thereof mirror polished, are prepared.

The concentration of the first and the second semiconductor substrate layers may be exchangeable with each other if necessary.

Figure 1A:
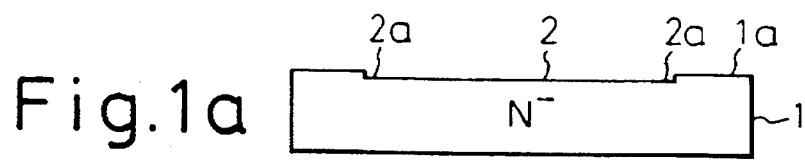
FIGS. 1a to 1f are diagrammatic views of the production steps of the first embodiment of the present invention.

As shown in FIG. 1a, a concave portion 2 having a depth of 0.2 to 2 μm is formed on the mirror polished main surface of the second semiconductor substrate 1 having a conductivity of $N^-$ by selectively etching a portion of the mirror polished main surface by a chemical etching or reactive ion etching (RIE) method.

Figure 1B:
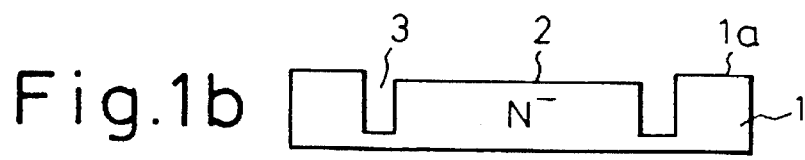

Then, as shown in the FIG. 1b, a groove 3, open on the bottom surface of the concave portion 2 and having a width and depth more than 2 μm and more than 2 μm, respectively, is formed along a boundary portion 2a of the concave portion 2 by a dicing method, chemical etching method or RIE method.

The groove 3 extends into the second semiconductor substrate layer 1, preferably perpendicular to the bottom surface of the concave portion 2. The groove 3 has openings on a side wall of the substrate 1 for introducing oxygen gas thereinto during on oxidizing process.

After that, both the $N^+$ type first semiconductor substrate 5 and the $N^-$ type second semiconductor substrate 1 are treated by carrying out the following steps in turn to fully clean the surface.

Boiling with trichloroethylene, such as "Trichlene" or the like.

Ultrasonic Cleaning with Acetone

Removing organic substances therefrom utilizing a mixture of $NH_3$, $H_2O_2$, and $H_2O$ ($NH_3:H_2O_2:H_2O=1:1:4$)

Removing contamination caused by metallic substances therefrom utilizing a mixture of HCl, $H_2O_2$, and $H_2O$ ($HCl:H_2O_2:H_2O=1:1:4$)

Cleaning with pure water.

After these operations, a step for removing an oxide film caused by natural oxidation is carried out utilizing a mixture of HF and $H_2O$ ($HF:H_2O=1:50$) and thereafter a step for forming an oxide film having a thickness of less than 15 Å on a surface of a wafer utilizing, for this embodiment, a mixture of $H_2SO_4$ and $H_2O_2$ ($H_2SO_4:H_2O_2=3:1$) are carried out to give the surface of the wafer a hydrophilic property.

Then, a step for cleaning with pure water is again carried out.

Finally, these substrates are dried with dry nitrogen or the like to control the amount of moisture absorbed in the surface of these substrates.

After these treatments, these semiconductor substrates 1 and 5 are brought into contact with each other with the mirror polished main surface 1a of the substrate 1 and the mirror polished main surface 5a of the substrate 5 closely connected to each other to form a semiconductor substrate portion 10.

The two semiconductor substrates 1 and 5 are adhered by hydrogen bonds created between silanol radicals formed on the surface of the semiconductor substrates and molecules of water.

The semiconductor substrates 1 and 5 of the semiconductor portion 10 are dried in a vacuum chamber with vacuum of less than 10 Torr.

At that time, a load of more than 30 g/cm$^2$ may be applied for compensating for deformation due to the treatment in the vacuum chamber.

Then, the semiconductor substrates 1 and 5 are subjected to heat treatment in an inert gas atmosphere such as nitrogen or argon at a temperature of more than 1100° C. for more than 1 hour to cause dehydration condensation, whereby Si-O-Si bonds are created.

When oxygen (O) is further diffused into the substrate, Si-Si bonds are created, whereby the two semiconductor substrates 1 and 5 are directly bonded by a wafer direct, bonding, method (WDB) to form a single semiconductor substrate portion 10.

Figure 1C:
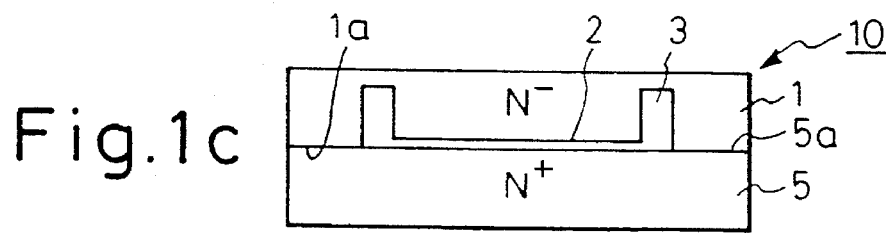

At this stage, the concave portion 2 formed on the surface of the second semiconductor substrate 1 is not connected to the opposite surface of the first semiconductor substrate 5, leaving a cavity portion therebetween (see FIG. 1c).

Figure 1D:
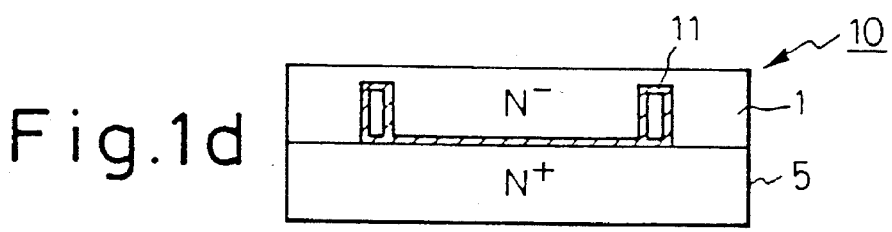

In the next step, as shown in FIG. 1d, the semiconductor substrate portion 10 is subjected to heat treatment in an oxidizing gas atmosphere such as, a mixed combustion gas consisting of dry $O_2$, wet $O_2$, or $H_2$ and $O_2$ at a temperature of more than 900° C. for more than 1 hour to oxidize the inside surface of the cavity portion through the groove 3 to form an oxide film 11 thereon.

This oxidation treatment should be continued until the oxide film formed on the surface of the semiconductor substrate 1 at the bottom portion of the concave portion 2 and the oxide film formed on the surface of the semiconductor substrate 5 opposite to the concave portion 2 grow enough to completely bury the cavity portion and to attain complete adherence with the Si-O bonds of.

To improve the oxidation speed of the concave portion 2 in the steps shown in FIGS. 1a and 1b, oxygen may be injected into the surface of the concave portion 2 for promoting the oxidation by an ion implantation method before the contacting operation.

Figure 1E:
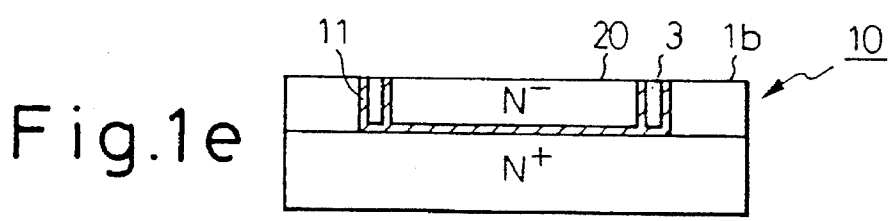

As shown in FIG. 1e, a part of the portion of the second semiconductor substrate 1 is then removed from the surface opposite to the surface contacting the first semiconductor substrate 5 by grinding, polishing, or etching until a part of the groove 3, the inside wall of which is covered with an oxide film 11, appears on the thus treated surface 1b of the semiconductor substrate 1.

Figure 1F:
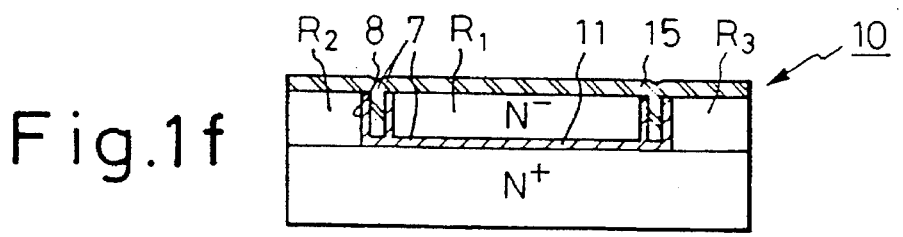

As shown in FIG. 1f, polycrystalline silicon 15 is deposited on the surface 1b by the CVD method to bury the groove 3.

Note that, in this example, while polycrystalline silicon is used to bury the groove 3, an oxide, nitride, or other insulating substance may be used.

Also any one of sputtering, vapor deposition and SOG may be used for burying the groove.

It is required that at least the opening of the groove 3 formed in the surface 1b of the substrate 1 be closed.

The inside of the groove 3 need not necessarily be filled completely with the burying material 11 or 15 of oxide, nitride or polycrystalline silicon, i.e., a cavity may remain in the groove 3.

After that, debris on the surface of the semiconductor substrate is removed and the surface smoothed by lap polishing, etch-back, etc., thereby giving a semiconductor substrate portion 10 having a region R1 completely and electrically isolated from other regions R2 and R3 by a burying material 11 or 15 such as an oxide, nitride, or polycrystalline silicon.

When predetermined elements, for example, logic circuits or power elements are provided in the regions R1–R3, a desired semiconductor circuit structure can be obtained.

Figure 2A:
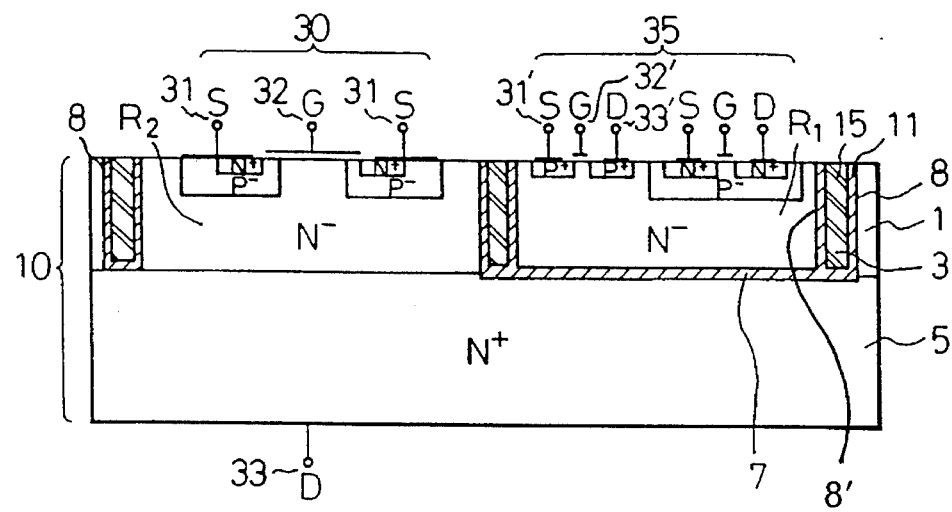
FIGS. 2a and 2b are cross-sectional views of the present invention.

FIG. 2a is a cross-sectional view of the semiconductor circuit structure produced by the method disclosed above.

In FIG. 2a, a transistor 30 is provided on the surface of the region R2 of the semiconductor substrate portion 10 to make a vertical power transistor.

Transistors 35 are provided on the surface of the region R1, electrically isolated from the region R2, to from a controlling transistor portion to control the power transistor.

The power transistor 30 is provided with a source electrode 31 and a gate electrode 32 on the top surface of the second semiconductor substrate layer 1 and is provided with a drain electrode 33 on the back surface of the first semiconductor substrate layer 5.

On the other hand, in the logic circuit 35, a source electrode 31', a gate electrode 32', and a drain electrode 33' are arranged in the same surface of the region R1 of the semiconductor substrate layer 1.

In this embodiment, the semiconductor substrate portion 10 is produced by directly bonding the first $N^+$ type semiconductor substrate layer 5 having a high concentration of impurities and the second $N^-$ type semiconductor substrate layer 1 having a low concentration of impurities.

The logic circuit 35 is formed in the region R1 of the semiconductor substrate layer 1 of the semiconductor substrate portion 10.

The region R1 is insulatingly isolated from other regions R2 or R3 of the semiconductor substrate layer 1 by a silicon oxide film 11 and burying substance 15.

Accordingly, the isolated region R1 has a good element characteristic because the region is formed with a single crystal substrate and has a high withstand voltage and superior heat resistance because of the region R1 being insulatedly isolated by the insulating layer 11 from the region R2 on which the transistor 30 is mounted.

Further, since a part of the isolating groove 3 is exposed at the surface of the semiconductor substrate layer 1, the alignment between the isolated region R1 and the elements formed on the surface thereof is simplified.

Figure 2B:
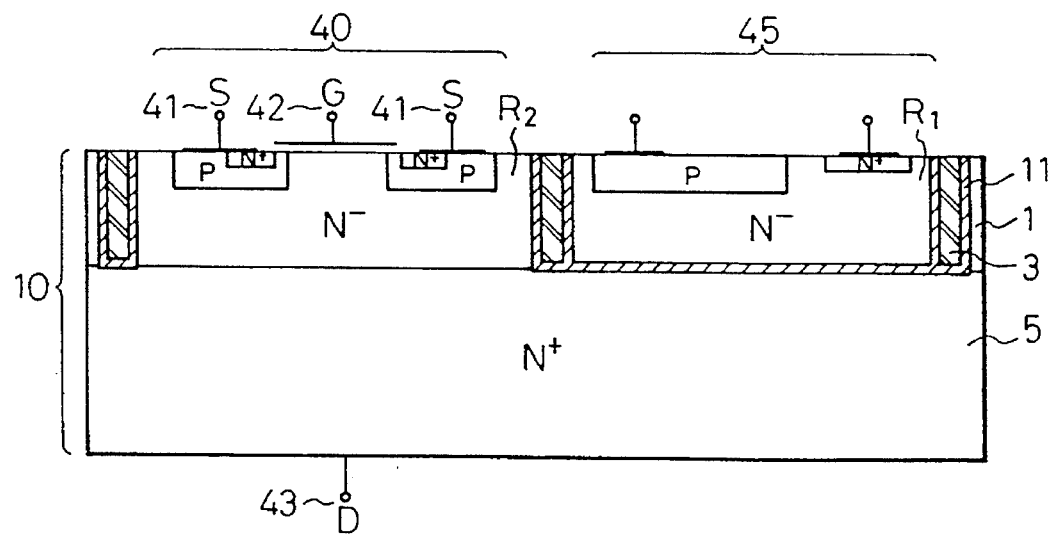

FIG. 2b is a cross-sectional view of the semiconductor circuit structure produced by the method of another embodiment of the present invention.

In FIG. 2b, a vertical power MOS transistor 40 and a photo diode 45 are mounted on one chip.

Electromotive force is generated from the photo diode 45 by a light beam radiated as an input signal from an LED or the like.

The transistor 40 is energized utilizing the electromotive force as a gate voltage.

The diode 45 is insulatedly isolated by the insulating layer 11.

It possesses a large isolating withstand voltage since leakage of electric current caused by photo electric current, appearing in an isolating structure utilizing a PN junction, does not exist.

Figure 3A:
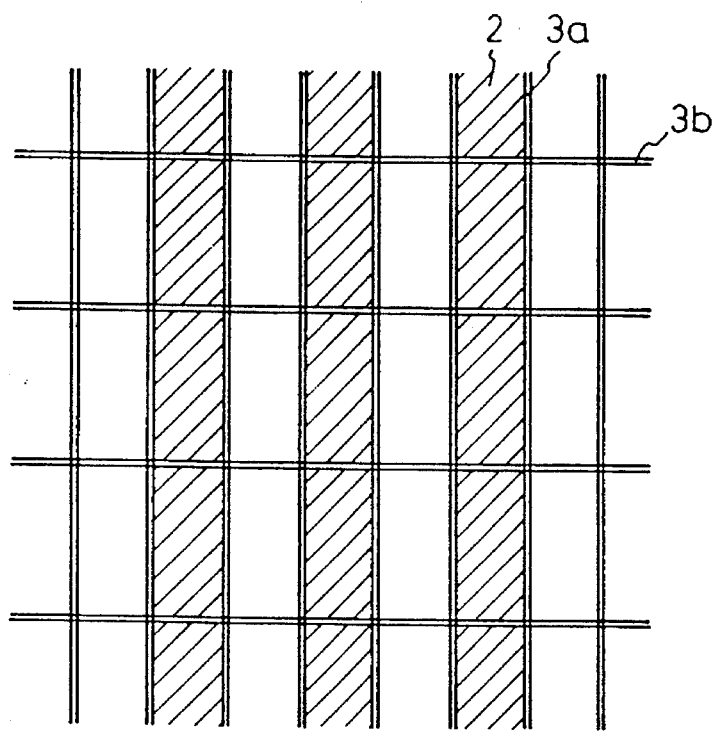
FIGS. 3a and 3b are plane views of the arrangement of concave portions and grooves formed in the production steps of the embodiment of the present invention.
Figure 3B:
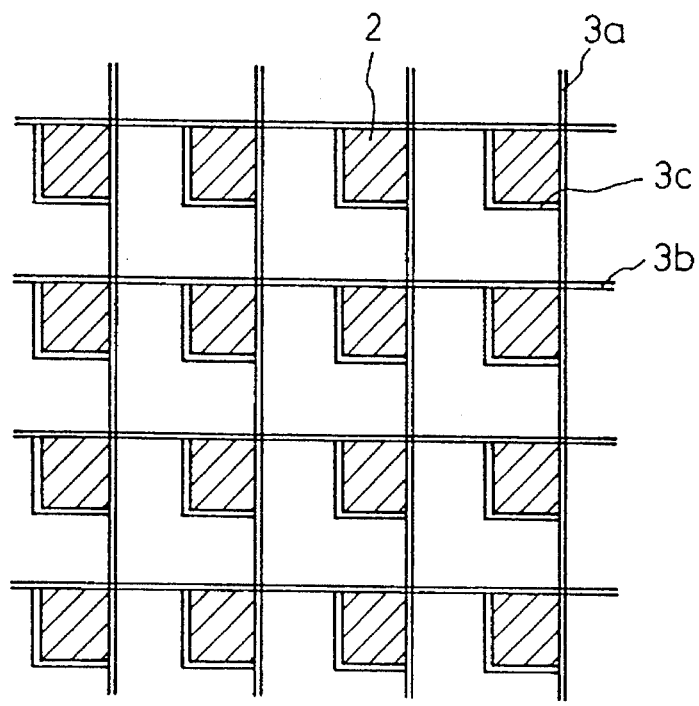

FIGS. 3a and 3b are plane views of the concave portion and the groove used in the first embodiment.

In FIG. 3a, the concave portions 2 are provided in the form of stripes on a surface of the semiconductor substrate layer 1.

The grooves 3a are provided along the side lines of the concave portions 2.

Separate grooves 3b are provided in a direction perpendicular to the groove 3a at a space of a whole multiple of the chip size therebetween.

However, if the case permits, the grooves 3b may be omitted.

In FIG. 3b, the concave portions 2 are provided in the form of islands on a surface of the semiconductor substrate layer 1.

The grooves 3a, 3b, and 3c are provided along the boundaries of the concave portion 2.

The grooves 3a and 3b are provided perpendicular to each other.

The ends are opened to the air at the ends of the substrate. The island like concave portions, however, may have any configuration.

In this embodiment, the semiconductor substrate portion 10 was provided as a combination of a first semiconductor substrate layer 5, i.e., an $N^+$ type substrate layer, and a second semiconductor substrate layer 1, i.e., an $N^-$ type substrate layer.

The concentration of the impurities thereof was optional, and further, each semiconductor substrate layer had a different conductivity from the other.

Moreover, a semiconductor substrate layer in which impurities are diffused in all or part of the surface may be used.

Further, a semiconductor substrate portion 10 produced by connecting two of more semiconductor substrate layers may be used.

Accordingly, in this invention, a semiconductor circuit structure can be produced from any configuration of semiconductor substrate portions.

Therefore, a semiconductor circuit structure including a layer having a low concentration of impurities with a relatively high thickness can be easily produced, thus contributing to making elements having high withstand voltages.

In the first embodiment explained above, the elements used therein were insulated gate type elements, but the element used in the present invention are not restricted.

Any kind of element such as diodes, bi-polar devices or thyristers, for example, can be used.

The semiconductor circuit structure of this invention thus produced has a region R1 formed on one main surface of the semiconductor substrate portion 10. The region R1 is insulatedly isolated from other regions R2 or R3 by a burying means 11 made of an insulating material, for example, an oxide film.

The burying means 11 includes a flat bottomed portion 7 and at least one side wall portion 8 provided on at least one edge portion of and integrally formed with the flat bottomed portion 11.

In this embodiment, the side wall portion 8 was formed at just the end portion of the bottom portion 7 of the burying means 11, but it may also be formed in the vicinity of the end of the bottom portion thereof.

Also the side wall 8 in this embodiment was formed perpendicular to the bottom surface of the burying means 11.

However, it may be formed with a certain angle to the surface of the burying means 11 other than a right angle. Further, the side wall 8 was duplicately formed, i.e., two side walls 8 and 8' were adjacently arranged, and the space formed therebetween, was filled with another insulating material, for example, polycrystalline silicon, but a single side wall portion having a thin width the same or nearly the same as the thickness of the bottom portion 7 of the burying means 11 can be used.

FIGS. 4a to 4f are the cross-sectional views of the process steps of a second embodiment of the present invention.

In the second embodiment, as shown in FIG. 4a, a concave portion 52 having a depth of 0.2 to 2 µm is provided on a mirror polished surface 50a of a second semiconductor substrate layer 50.

As shown in FIG. 4b, separate concave portions 53 are provided at a boundary of the concave portion 52 to a depth of more than 2 µm deeper than the concave portion 52 and opening on the bottom surface of the concave portion 52.

As shown in FIG. 4c, grooves 55 are provided at the bottom portion of the separate concave portions 53 downwardly extending into the second semiconductor substrate layer 50, preferably perpendicular to the bottom surface thereof.

The grooves 55 have a width of 0.2 to 2 µm and a depth of more than 2 µm and much deeper than the concave portions 53.

In this embodiment, the grooves 55 may be provided anywhere at the bottom surface of the concave portion 53.

As shown in FIG. 4d, the substrate layers are cleaned in the same manner as explained in the first embodiment, then the first semiconductor substrate layer 60 and the second semiconductor substrate layer 50 are brought into contact so that the mirror polished surface 60a of the first semiconductor substrate layer 60 and that 50a of the second semiconductor substrate layer 50 are directly connected to each other in the same manner as described in the first embodiment to produce a single semiconductor substrate portion 100 having a cavity formed by the grooves 55, the separate concave portions 53, and the space defined by the top surface of the first semiconductor substrate layer 60 and the bottom surface of the concave portion 52.

As shown in FIG. 4e, the inside portion of the cavity is oxidized by an oxidation process through the concave portions 53 so as to bury the grooves 55 and the space defined by the top surface of the first semiconductor substrate layer 60 and the bottom surface of the concave portion 52 with an oxide.

The inside surfaces of the concave portions 53 are covered by an oxide film 70 with a remaining space therein.

Thereafter, the two substrates are fixedly adhered to each other.

As shown in FIG. 4f, the free end surface of the second semiconductor substrate layer 50 is then ground or etched until a part of the grooves 55 appears on the thus treated surface 110, thereby obtaining a region R1 which is insulatedly isolated from the other regions R2 and R3 by the oxide film 70.

In this embodiment, as shown in FIG. 4e, the grooves 55 and the space defined by the top surface of the first semiconductor substrate layer 60 and the bottom surface of the concave portion 52 are buried with an oxide such as an oxide film 70, so an operation for burying the spaced portions with some insulating materials after the grinding or etching operation is not required.

As shown in FIG. 4f, in the semiconductor circuit construction obtained in the second embodiment, the semiconductor substrate portion 100 includes an $N^+$ type semiconductor substrate layer 60 as the first semiconductor substrate layer and an $N^-$ type semiconductor substrate layer 50 as the second semiconductor substrate layer.

In the second semiconductor substrate layer 50, a plurality of regions are provided and a region R1 made of an $N^-$ type semiconductor substrate layer is electrically isolated from other regions R2 and R3, also made of $N^-$ type semiconductor substrate layers by burying means 70, for example, an oxide film, comprising a bottom portion 70a provided on the surface of the first semiconductor substrate layer 60, with step like portions 70c provided at the two ends thereof and side wall portions 70b projecting upwardly from the top surface of the step like portions 70c.

FIGS. 5a to 5e are cross-sectional views of the process steps of a third embodiment of the present invention.

In this embodiment, as shown in FIGS. 5a and 5b, first and second semiconductor substrate layers 160 and 150 are at first prepared.

The first semiconductor substrate layer 160 has a mirror polished surface 160a and there on, a concave portion 162 having a depth and width more than 2 μm and opened on the mirror polished surface 160a.

The second semiconductor substrate layer 150 has a mirror polished surface 150a and thereon, a concave portion 152 having a depth of 0.2 to 2 μm and grooves 153 extending downwardly into the substrate 150 from the two end portions of the concave portion 152.

The two substrates 150 and 160 are then subjected to the same cleaning operation as explained in the first embodiment.

The substrates 150 and 160 are then brought into contact so that the mirror polished surfaces 150a and 160a oppose each other face to face and the concave portions 162 and 152 are oppositely arranged, in the same manner as in the first embodiment, as shown in F.

As shown in FIG. 5d, the inside portion of the space formed in the assembly is oxidized by a suitable oxidizing process through the concave portion 162.

The grooves 153 and the space defined by the top surface of the first semiconductor substrate layer 160 and the bottom surface of the concave portion 152 are thereby buried with an oxide 210 such as an oxide film, while the inside surface of the concave portion 162 is covered with the oxide film, leaving a space inside.

Thereafter the two substrates are fixedly adhered to each other to form the single semiconductor substrate portion 200.

As shown in FIG. 5e, the free end surface of the second semiconductor substrate layer 150 is then ground or etched until a part of the grooves 153 appears on the thus treated surface 220.

Therefore a region R1 is obtained which is insulatedly isolated from the other regions R2 and R3 by the oxide film 210.

In the third embodiment, an operation for burying the spaced portions with some insulating materials after the grinding or etching operation is not required.

FIGS. 6a to 6e are the cross-sectional views of the process steps of the fourth embodiment of the present invention.

In this embodiment, as shown in FIGS. 6a and 6b, a first semiconductor substrate layer 250, having a mirror polished surface 250a and a first concave portion 252, and a second semiconductor substrate layer 260, having a mirror polished surface 260a and a projecting portion 261 projecting from a mirror polished surface 262 with a height less than the depth of the first concave portion 252 by 0.2 to 2 μm and having grooves 263 extending downwardly into the semiconductor substrate layer 260 at the two boundary end portions of the projecting portion 261, are prepared.

In the second semiconductor substrate layer 260, the grooves 263 have a depth of more than 2 μm from the surface 262 of the substrate 260 and a width of more than 2 μm.

In this embodiment, the width of the projecting portion 261 having a mirror polished surface 260a, formed on the surface of the second semiconductor substrate layer 260, may be less than the width of the concave portion 252 formed on the first semiconductor substrate layer 250 by 0.4 μm or more, so that the projecting portion 261 is inserted into the concave portion 252 when the two substrates are brought in contact with the mirror polished surfaces opposing each other.

As shown in FIG. 6c, the first semiconductor substrate layer 250 and the second semiconductor substrate layer 260 are brought into contact with each other with the two mirror polished surfaces 250a and 262 directly bonded, in the same manner as in the first embodiment, so that the projecting portion 261 is inserted into the concave portion 252 of the first semiconductor substrate layer 250.

This gives a single semiconductor substrate portion 300.

In this embodiment, the mirror polished surfaces 250a and 262 of the semiconductor substrate layers 250 and 260 may be brought into contact with an oxide film formed therebetween.

As shown in FIG. 6d, an oxidizing operation is then carried out through the groove 263 to oxidize the inside wall portion of the cavity formed in the semiconductor substrate portion 300.

The cavity portion 253, except the groove 263, is buried with the oxide film 310 to closely adhere the substrates to each other.

In the groove 263, the inside wall is covered with the oxide film, although the central part of the inside cavity of the groove remains vacant.

Thereafter, the free end surface of the second semiconductor substrate layer 260 is ground or etched until the surface of the first semiconductor substrate layer 250 is uncovered.

This gives a region R1 which is insulatedly isolated from the other regions R2 and R2' by the oxide film 310.

In this embodiment, the first semiconductor substrate layer 250 may be an $N^+$ type semiconductor substrate layer while the second semiconductor substrate layer 260 may be an $N^-$ type semiconductor substrate layer, or vice versa, giving the region R1 a different amount of impurities from the other regions.

In the final product, i.e., the semiconductor circuit structure, the semiconductor substrate portion 300 mainly consists of the semiconductor substrate layer 250 having a surface divided into a plurality of regions, one region R1 electrically and insulatedly isolated from other regions R2 and R2' by burying means made of, for example, an oxide film comprising a bottom portion 7 and side wall portion 8.

The region R1 may also be made of an N⁻ type semiconductor substrate layer, while the other regions R2 and R2' may be made of N⁺ type semiconductor substrate layer.

Further, for the substrate 250, use may be made of a diffusion wafer or directly adhered wafer forming a layer of a high concentration of impurities on a semiconductor substrate layer having a low concentration of impurities.

This is especially effective when a high withstand voltage power element and an insulated isolating region formed by a thin film are both mounted on one chip.

We claim:

1. A semiconductor circuit structure having a dielectric isolation region therein, comprising:

a first semiconductor substrate having a top surface;

a second semiconductor substrate having a bottom surface coupled to said top surface of said first semiconductor substrate;

a first driving circuit portion formed in said second semiconductor substrate;

a second driving circuit portion formed in said second semiconductor substrate;

a vertically arranged insulating film comprising a plurality of insulating film layers, formed between said first driving circuit portion and said second driving circuit portion;

a single layered, laterally arranged, and substantially flat insulating film at an interface between said bottom surface of said second semiconductor substrate and said top surface of said first semiconductor substrate, said laterally arranged insulating film having a top surface and a bottom surface which are substantially parallel to one another, said bottom surface of said laterally arranged insulating film abutting said first semiconductor substrate, and said top surface of said laterally arranged insulating film abutting said second semiconductor substrate, an end of said laterally arranged insulating film terminating at a point at which said laterally arranged insulating film contacts said vertically arranged insulating film so as not to project laterally from said contact point and no insulating film is in between said first semiconductor substrate and said second semiconductor substrate adjacent to said end;

an isolated region formed within said second semiconductor substrate and including an entire area inside a perimeter defined by said vertically arranged insulating film and said top surface of said single, laterally arranged insulating film, wherein said first driving circuit portion is provided in said isolated region and said second driving circuit portion is provided outside of said isolated region.

2. A semiconductor circuit structure according to claim 1, wherein said vertically arranged insulating film comprises a groove having an opening at said top surface of said first semiconductor substrate, said groove being filled with a material.

3. A semiconductor circuit structure according to claim 2, further comprising an insulating film on an inside wall of said groove.

4. A semiconductor circuit structure according to claim 2, wherein said material filling said groove is any one of materials selected from a polycrystalline silicon, an oxide, and a nitride.

5. A semiconductor circuit structure according to claim 1, wherein said laterally arranged insulating film is formed of a continuous and homogeneous material.

6. A semiconductor circuit structure according to claim 1, wherein said laterally arranged insulating film is a thermal oxidized film.

7. A semiconductor circuit structure according to claim 1, wherein a thickness of said second semiconductor substrate is defined by a vertical height of said isolated region.

8. A semiconductor circuit structure according to claim 2, wherein a thickness of said second semiconductor substrate is defined by a vertical height of said isolated region and a height of said vertically arranged insulating film.

9. A semiconductor circuit structure according to claim 1, wherein each of said first and second driving circuit portions is made of a monocrystalline-semiconductor substance.

10. A semiconductor circuit structure according to claim 1, wherein said first driving circuit portion is made of a material having a same concentration of impurities as said second driving circuit portion.

11. A semiconductor circuit structure according to claim 1, wherein said first driving circuit portion is made of a material having a different concentration of impurities from that of the second driving circuit portion.

12. A semiconductor circuit structure according to claim 1, wherein said first semiconductor substrate is made of a material having a same concentration of impurities as that of said second semiconductor substrate.

13. A semiconductor circuit structure according to claim 1, wherein said first semiconductor substrate is made of a material having a different concentration of impurities than that of said second semiconductor substrate.

14. A semiconductor circuit structure according to claim 1, wherein said second semiconductor substrate is a single crystal semiconductor material.

15. A semiconductor circuit structure according to claim 1, wherein said vertically arranged insulating film is contacted to said laterally arranged insulating film, said vertically arranged insulating film being perpendicularly arranged to said laterally arranged insulating film.

16. A semiconductor circuit structure having a dielectric isolation region therein, comprising:

a first semiconductor substrate having a top surface;

a second semiconductor substrate having a bottom surface coupled to said top surface of said first semiconductor substrate;

a first driving circuit portion formed in said second semiconductor substrate;

a second driving circuit portion formed in said second semiconductor substrate;

a vertically arranged insulating film comprising a plurality of insulating film layers, formed between said first driving circuit portion and said second driving circuit portion;

a single layered, laterally arranged, and substantially flat insulating film at an interface between said bottom surface of said second semiconductor substrate and said top surface of said first semiconductor substrate, said laterally arranged insulating film having a top surface and a bottom surface which are substantially parallel to one another, said bottom surface of said laterally arranged insulating film abutting said first semiconductor substrate, and said top surface of said laterally arranged insulating film abutting said second semiconductor substrate, an end of said laterally arranged insulating film terminating at a bottom end of said vertically arranged insulating film and no insulating film is in between said first semiconductor substrate and said second semiconductor substrate adjacent to said end;

an isolated region formed within said second semiconductor substrate and including an entire area inside a perimeter defined by said vertically arranged insulating film and said top surface of said single, laterally arranged insulating film, wherein said first driving circuit portion is provided in said isolated region and said second driving circuit portion is provided outside of said isolated region.

17. A semiconductor circuit structure according to claim 16, wherein said vertically arranged insulating film is contacted to said laterally arranged insulating film, said vertically arranged insulating film being perpendicularly arranged in relation to said laterally arranged insulating film.

18. A semiconductor circuit structure having a dielectric isolation region therein, comprising:

a first semiconductor substrate having a top surface;

a second semiconductor substrate having a bottom surface coupled to said top surface of said first semiconductor substrate;

a first circuit portion formed in said second semiconductor substrate;

a second circuit portion formed in said second semiconductor substrate;

a vertically arranged insulating film comprising a plurality of insulating film layers, formed between said first circuit portion and said second circuit portion;

a laterally arranged and substantially flat insulating film at an interface between said bottom surface of said second semiconductor substrate and said top surface of said first semiconductor substrate, said laterally arranged insulating film having a top surface and a bottom surface which are substantially parallel to one another, said bottom surface of said laterally arranged insulating film abutting said first semiconductor substrate, and said top surface of said laterally arranged insulating film abutting said second semiconductor substrate, an end of said laterally arranged insulating film terminating at a point at which said laterally arranged insulating film contacts said vertically arranged insulating film so as not to project laterally from said contact point and no insulating film is in between said first semiconductor substrate and said second semiconductor substrate adjacent to said end;

an isolated region formed within said second semiconductor substrate and including an entire area inside a perimeter defined by said vertically arranged insulating film and said top surface of said single, laterally arranged insulating film, wherein said first circuit portion is provided in said isolated region and said second circuit portion is provided outside of said isolated region.

19. A semiconductor circuit structure according to claim 18, wherein said second semiconductor substrate is a single crystal semiconductor material.

* * * * *

UNITED STATES PATENT AND TRADEMARK OFFICE
CERTIFICATE OF CORRECTION

PATENT NO. : 5,461,253
DATED : October 24, 1995
INVENTOR(S) : TSURUTA et al.

It is certified that error appears in the above-identified patent and that said Letters Patent is hereby corrected as shown below:

ON THE COVER PAGE:
Reads:

[73] Assignee: Nippon Steel Inc., Nishi, Japan

Should Read:

[73] Assignee: Nippon Soken, Inc., Nishio-shi, Japan

Signed and Sealed this

Fourth Day of June, 1996

Attest:

BRUCE LEHMAN

Attesting Officer     Commissioner of Patents and Trademarks